(12) United States Patent
Aisu

(10) Patent No.: US 7,382,187 B2
(45) Date of Patent: Jun. 3, 2008

(54) SEMICONDUCTOR INTEGRATED CIRCUIT AND AMPLIFIER FOR SUPPRESSING POP SOUND WHILE MINIMIZING VOLTAGE TRANSITION SETTLING TIME

(75) Inventor: Katsuhiko Aisu, Hyogo-ken (JP)

(73) Assignee: Ricoh Company, Ltd., Tokyo (JP)

( * ) Notice: Subject to any disclaimer, the term of this patent is extended or adjusted under 35 U.S.C. 154(b) by 817 days.

(21) Appl. No.: 10/763,343

(22) Filed: Jan. 23, 2004

(65) Prior Publication Data

US 2004/0175007 A1 Sep. 9, 2004

(30) Foreign Application Priority Data

Jan. 27, 2003 (JP) ............... 2003-017506

(51) Int. Cl.
*H03F 1/00* (2006.01)
(52) U.S. Cl. ..................................... 330/151
(58) Field of Classification Search ............... None
See application file for complete search history.

(56) References Cited

U.S. PATENT DOCUMENTS

| | | | | |
|---|---|---|---|---|
| 3,903,485 A | * | 9/1975 | Dolby | 333/14 |
| 4,123,709 A | * | 10/1978 | Dodds et al. | 375/249 |
| 4,675,905 A | * | 6/1987 | Flora et al. | 381/81 |
| 5,199,079 A | * | 3/1993 | Anderson et al. | 381/94.5 |
| 5,227,793 A | | 7/1993 | Aisu | 341/136 |
| 5,796,851 A | * | 8/1998 | Hewitt et al. | 381/94.5 |
| 6,278,322 B1 | | 8/2001 | Aisu et al. | 330/255 |
| 7,092,534 B2 | * | 8/2006 | Wang et al. | 381/94.5 |
| 2003/0058040 A1 | * | 3/2003 | Miyagaki et al. | 330/10 |
| 2004/0175007 A1 | * | 9/2004 | Aisu | 381/120 |
| 2005/0025322 A1 | * | 2/2005 | Henson et al. | 381/120 |
| 2005/0084120 A1 | * | 4/2005 | Hagino | 381/120 |
| 2005/0195991 A1 | * | 9/2005 | Wang et al. | 381/94.5 |
| 2006/0023897 A1 | * | 2/2006 | Ginsberg et al. | 381/94.8 |
| 2006/0245602 A1 | * | 11/2006 | Chi et al. | 381/94.5 |

FOREIGN PATENT DOCUMENTS

| | | |
|---|---|---|
| JP | 49-8153 | 1/1974 |
| JP | 2-271703 | 11/1990 |
| JP | 6-120739 | 4/1994 |
| JP | 7-7404 | 1/1995 |
| JP | 7-22898 | 5/1995 |
| JP | 11-122813 | 4/1999 |
| JP | 2002-208821 | 7/2002 |

* cited by examiner

*Primary Examiner*—Benny Lee
*Assistant Examiner*—Krista M Flanagan
(74) *Attorney, Agent, or Firm*—Cooper & Dunham, LLP

(57) ABSTRACT

A semiconductor integrated circuit includes a capacitor element which defines a prescribed decay time constant with one or more resistors, an MOS transistor connected to the capacitor element via its gate, and a constant current generating element which generates a constant current. The capacitor element is charged with the constant current so as to create a linearly changing voltage. The linearly changing voltage is applied to the gate so that the MOS transistor can accordingly output a smoothly changing current.

6 Claims, 8 Drawing Sheets

SEMICONDUCTOR INTEGRATED CIRCUIT AND AMPLIFIER FOR SUPPRESSING POP SOUND WHILE MINIMIZING VOLTAGE TRANSITION SETTLING TIME

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

1. Field

The present specification relates generally to semiconductor integrated circuits and amplifiers employing a semiconductor integrated circuit for driving an acoustic element, and in particular to semiconductor integrated circuits and such amplifiers capable of reducing a pop sound while minimizing a voltage transition settling time for settling a voltage transition when an operational condition changes.

2. Discussion of the Related Art

A conventional amplifier driving an acoustic element such as a headphone sometimes generates a strange sound such as a pop sound, when an operational condition changes, such as when electric power is supplied for the first time, a sleep mode which saves electric power consumption starts or is terminated, etc. Such a pop sound is generally reduced by using a prescribed voltage signal which has rise and decay moderated by a large capacitance ($C_{LARGE}$) and a plurality of resistances (R0, R1) which have a prescribed decay time constant as discussed in the Japanese Utility Model Patent Publication No. 7-22898. Reference signs "M0", "slp", and "out" appearing in the publication represent a MOS transistor, an input signal designating a sleep mode, and an output signal output from a driving amplifier, respectively. Specifically, in order to reduce the pop sound, the output itself is directly moderated. Otherwise, a reference voltage input to the driving amplifier is moderated in order to indirectly moderate the output.

Rising (or decaying) waveforms of such input and output signals "slp" and "out" are exemplified in FIGS. 8A and 8B, and are generally calculated by the following formula, wherein the reference signs "A", "T", "C", and "R" represent a change in a voltage in accordance with a change in an operational condition, time elapsing, capacitance, and a resistance value, respectively:

$$A \times (1 - \exp(-T/(C \times R)))$$

According to such a state of art, however, an inclination of the voltage is sharpest immediately after commencement of charging or discharging a capacitor element as illustrated in FIG. 8B, and thereby the pop sound is likely generated. In order to avoid the pop sound from reaching a displeasurable level, a high voltage transition settling time, for example, a few seconds, are necessitated in such a state of art. As a result, voltage transition settling time necessarily delays an up and run time for an instrument, when the electric power is supplied for the first time or the like occurs as a problem.

SUMMARY

Accordingly, an object of the present disclosure is to address and resolve such and other problems and provide a new semiconductor integrated circuit.

The above and other objects are achieved by providing a novel semiconductor integrated circuit including a capacitor element, an MOS transistor connected to the capacitor element via its gate, and a constant current generating element which generates a constant current. The preferred embodiment charges the capacitor element with the constant current to create and apply a linearly changing voltage to the gate. The controller controls the MOS transistor to output a smoothly changing current in accordance with the linearly changing voltage.

In another embodiment, a driving amplifier which drives an acoustic element includes such a semiconductor integrated circuit.

In yet another embodiment, the driving amplifier includes an inversion operational amplifier having a positive reference input terminal, and the output of the semiconductor integrated circuit is applied to the positive reference input terminal.

In yet another embodiment, a semiconductor integrated circuit smoothly changes an output of the driving amplifier using the semiconductor integrated circuit when an operational condition changes.

BRIEF DESCRIPTION OF DRAWINGS

A more complete appreciation of the present disclosure and many of the attendant advantages thereof can be more readily understood from the following detailed description when considered in connection with the accompanying drawings, wherein.

PREFERRED EMBODIMENTS OF THE PRESENT DISCLOSURE

Figure 1A:
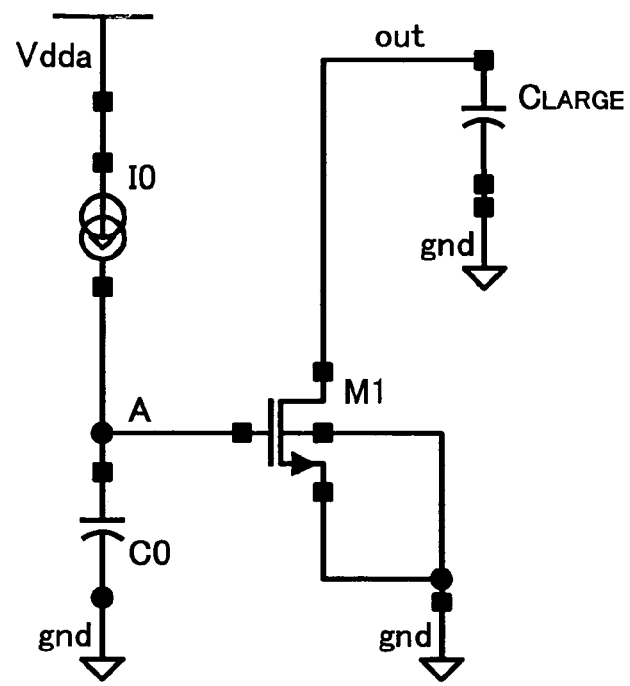
FIG. 1A illustrates a circuit employing an N-channel MOS transistor, in accordance with a preferred embodiment of the present disclosure.

A description of some exemplary embodiments is provided below with reference to the drawings, wherein like reference numerals designate identical or corresponding parts throughout several views.

Figure 1B:
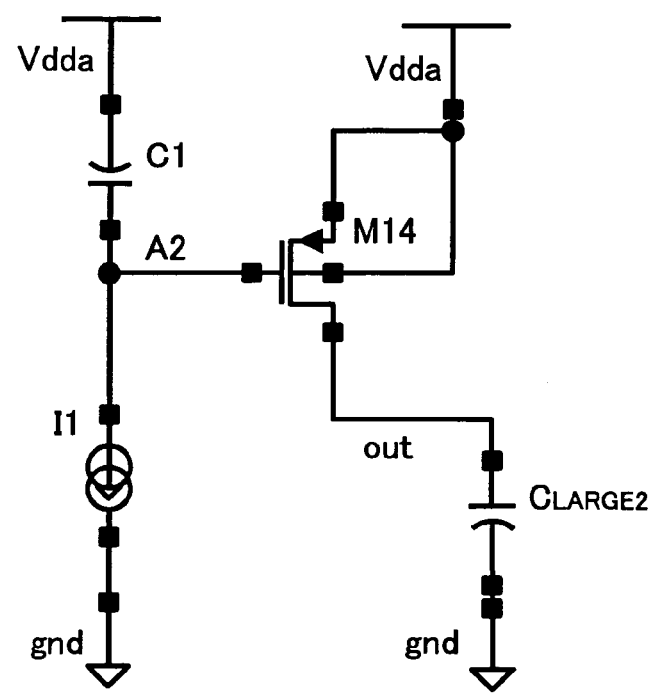
FIG. 1B illustrates such a circuit employing a P-channel MOS transistor.

In particular in FIGS. 1A and 1B, the reference numerals M1 and M14 represent an N-channel MOS transistor and a P-channel MOS transistor, respectively. The reference numerals I0 and I1 represent constant current sources, $C_0$ and $C_1$ represent capacitor elements, and the reference numerals $C_{LARGE}$ and $C_{LARGE2}$ represent large capacitor elements.

A signal rising (or decaying) waveform may be generated in a manner that a linear voltage is initially generated by charging (or discharging) a capacitor element with a constant current and is then applied to an MOS transistor as a gate and source voltage. The large capacitor element $C_{LARGE}$, typically arranged outside the IC, may be charged (or discharged) with a drain current flowing from the MOS transistor.

As a result, the conventional problem of a sharp inclination can be moderated without unnecessarily prolonging a voltage transition settling time period.

Figure 4:
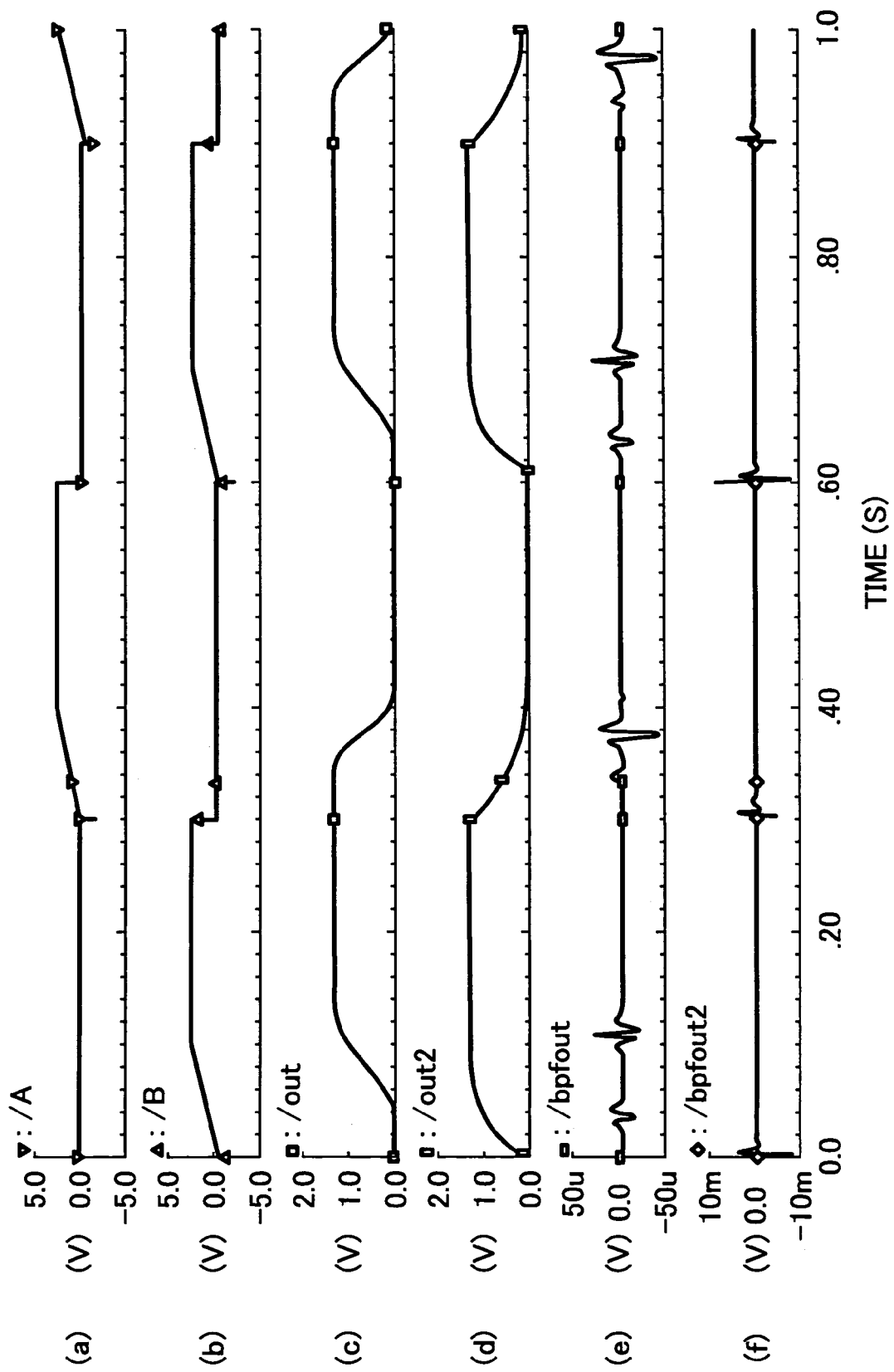
FIGS. 4A to 4F illustrate voltage waveforms appearing at points "A", "B", "out", and "out2", and those of "bpfout" and "bpfout2" appearing after passing through a baseband filter in the circuit of FIG. 3.

Specifically, as shown in FIG. 1A, when voltages of both ends of the capacitor C0 are zero volts at the time of T=0 (see FIG. 4), the capacitor C0 is charged with a current flowing from the constant current source I0. Since a change in a voltage may be calculated at the point A by the following formula, a linear voltage may be generated:

$$dV/dt = I/C = \text{constant}$$

Figure 2:
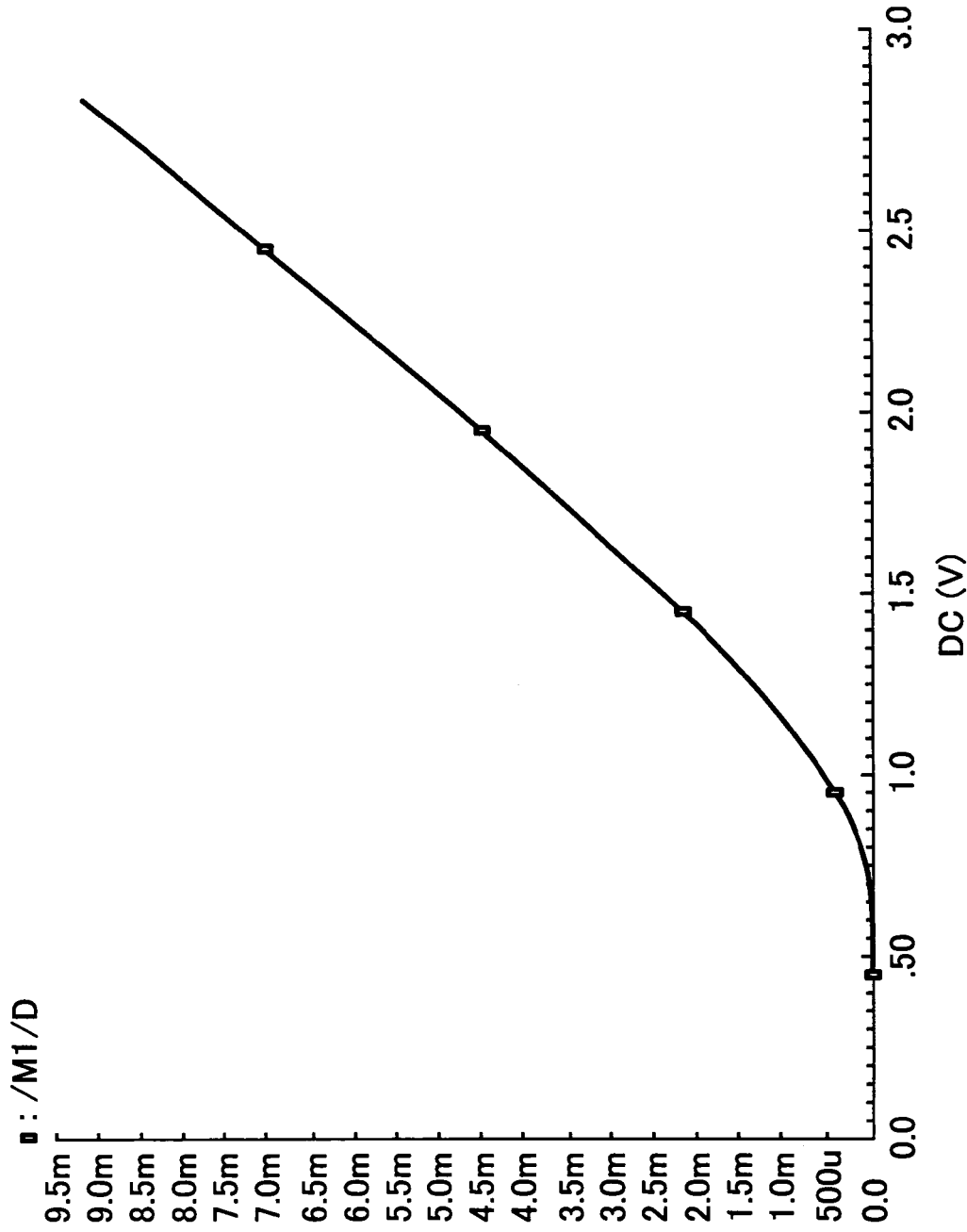
FIG. 2 illustrates Vgs-Id characteristics for such a transistor.

If such a linear voltage is applied to the MOS transistor as a gate and source voltage, a drain current flowing from the MOS transistor smoothly rises and has Vgs-Id characteristics as shown in FIG. 2. Accordingly, the immediate change sharply appearing after the commencement of charging (or discharging) in the conventional circuit can be moderated, and thereby the pop sound may be reduced or sometimes even eliminated.

A first specific embodiment is now described with reference to FIG. 3. Specifically, as shown, a voltage signal "slpb" which is an inversion of the voltage signal "slp" is employed. That is, when the signal slp is in a high level, the signal slpb is in a sleeping level. When the signal slp is in a low level, the slpb is in an active level. An output terminal "out" is a ground level ("gnd") in a sleeping mode, and a Vref level in an active mode, respectively. The resistances R0 and R1 may be connected to the output terminal out for the purpose of adjusting a rising (and/or decaying) signal waveform. However, it can be omitted or shorted.

According to such a preferred embodiment, a change in a voltage in accordance with a change in an operational condition at each of the nodes A, B, and out appears as shown in FIGS. 4A to 4C, respectively. In particular, the voltage of the output terminal out apparently changes smoothly.

Figure 7:
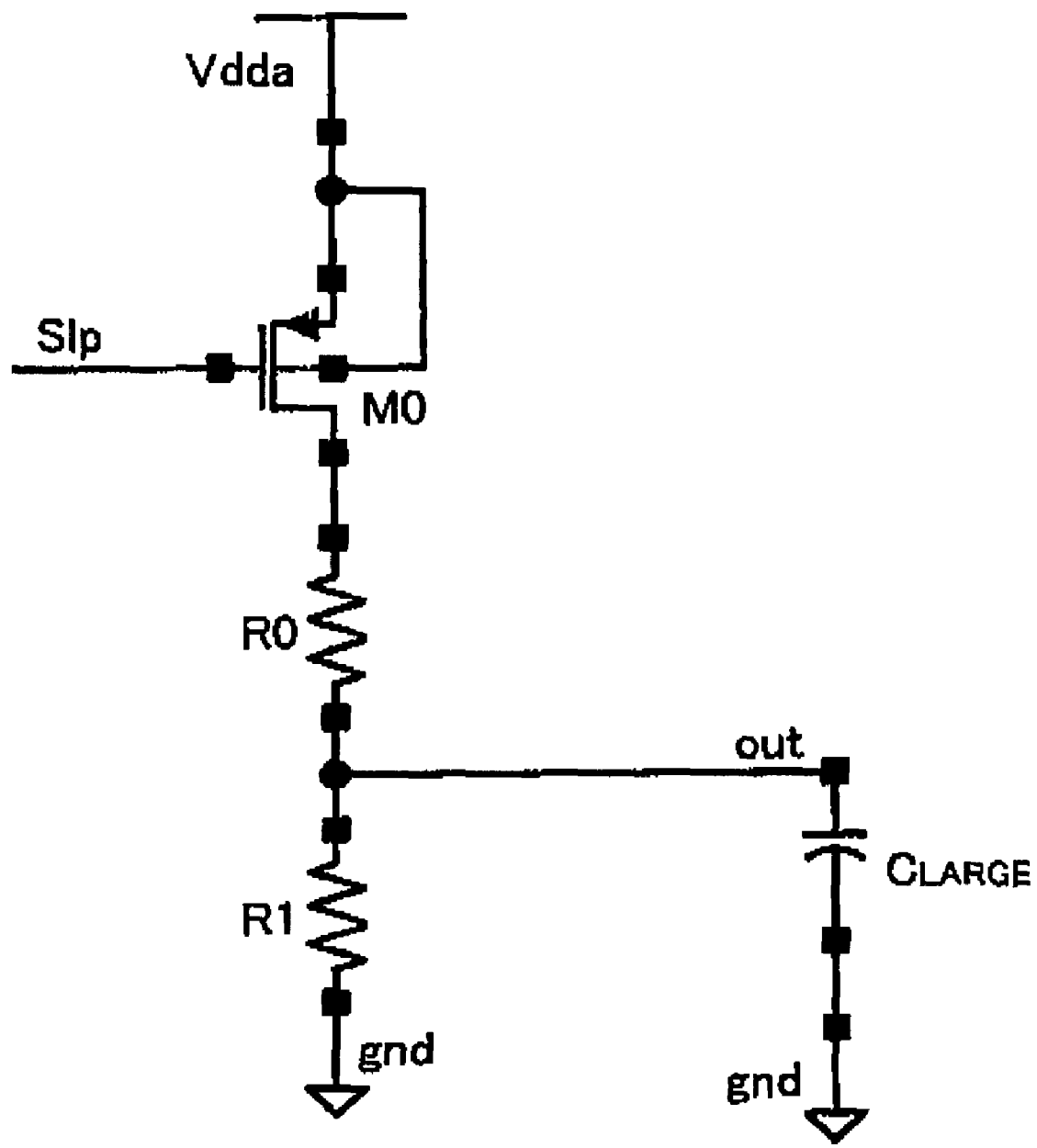
FIG. 7 illustrates a conventional circuit for driving an acoustic element.
Figure 8A:
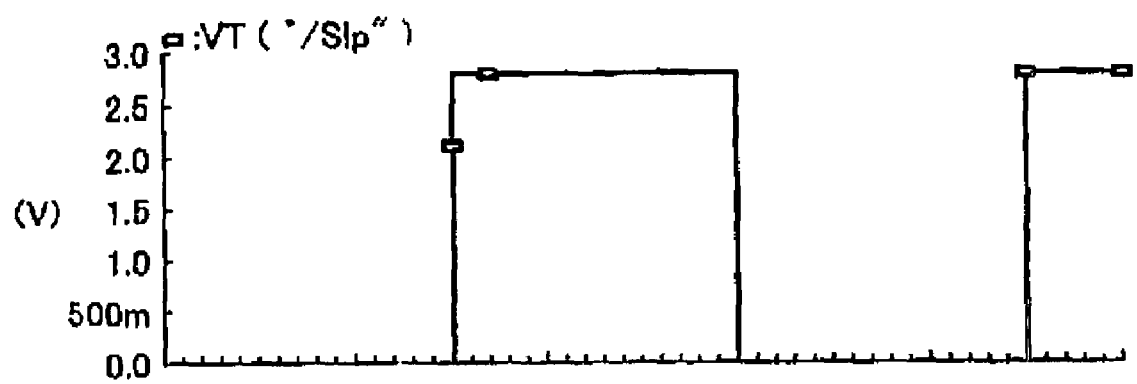
FIG. 8A illustrates a conventional waveform as an input signal of the conventional circuit of FIG. 7.
Figure 8B:
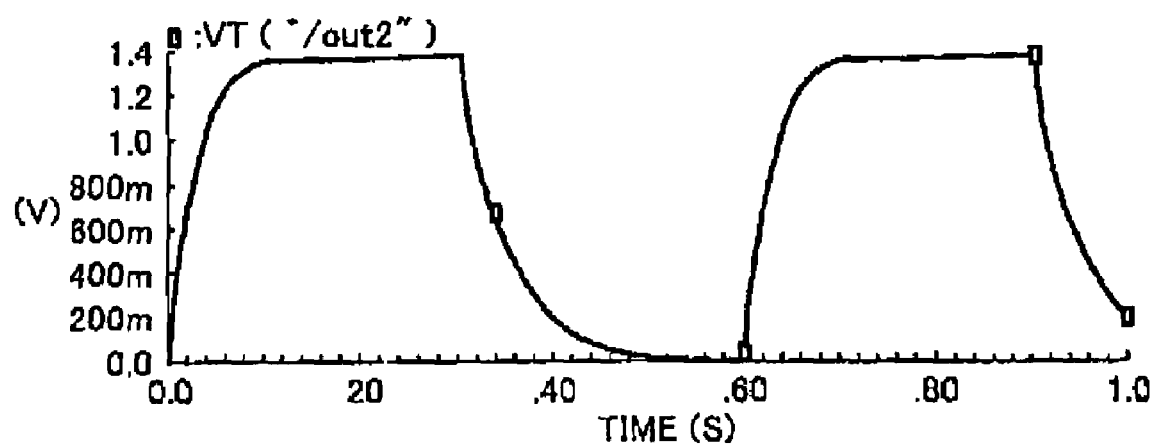
FIG. 8B illustrates a conventional waveform as an output signal of the conventional circuit of FIG. 7.

It is also apparent from FIG. 4D when compared with the output out (FIG. 4C) that an output "out2" lacks smoothness at an initial stage of the voltage change. The output out2 is conventionally obtained by adjusting the elements of the circuit of FIG. 7 so as to enable its voltage transition settling time to almost correspond to that of the output out.

Further, as shown in FIGS. 4E and 4F, filter output waveforms "bpfout" and "bpfout2" are obtained by having the above-mentioned outputs out and out2, respectively, undergo filtering of a filter (e.g., band pass filter bpf) which only allows a human audible frequency, the latter (i.e. bpfout2) may be larger. Because, a scale of the waveform bpfout2 is a double figure of that of the waveform bpfout. Based on experimentation, the largeness is considered to correlate to that of a strange sound. Specifically, the larger the scale, the greater the strange sound.

In such a situation, the amplitude of the waveform bpfout can of course be suppressed by prolonging a decay time period. However, the voltage transition settling time period results in becoming intolerably long. Thus, this option is unemployable.

Figure 5:
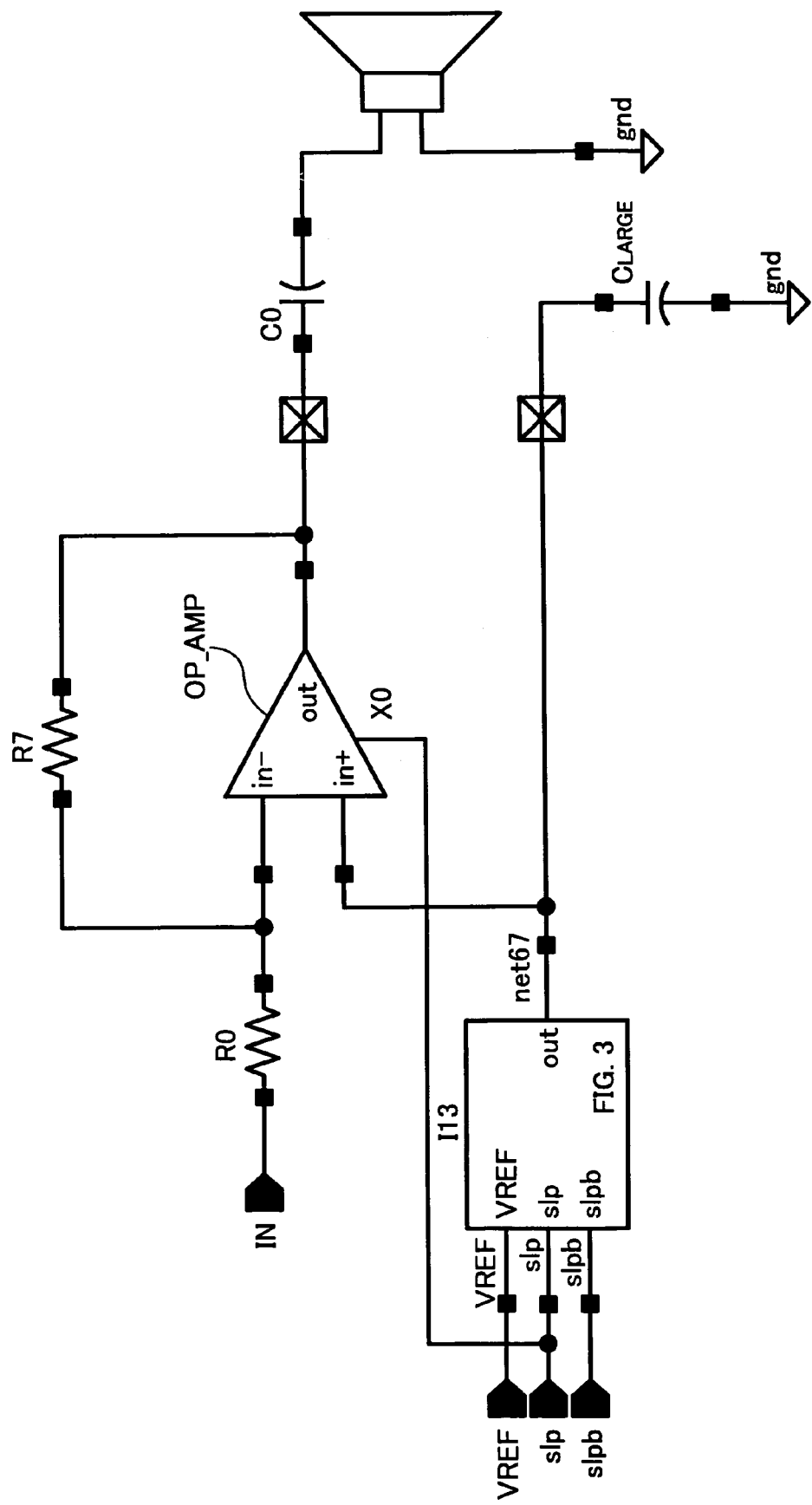
FIG. 5 illustrates a circuit of an amplifier driving an acoustic element, according to an embodiment which employs the semiconductor integrated circuit of FIG. 3.

Additional exemplary embodiments are now described with reference to FIGS. 5 and 6. One embodiment may be a headphone amplifier including the semiconductor circuit of FIG. 3, as shown in FIG. 5. The capacitor element $C_{LARGE}$ is, however, externally connected. A driving amplifier is turned ON when an operational condition changes. The output of the driving amplifier can similarly be controlled to change smoothly as mentioned earlier. A signal slp input to an amplifier can preferably be used commonly. It can separately be controlled, however, and still falls within the scope of the present disclosure and the appended claims.

Figure 3:
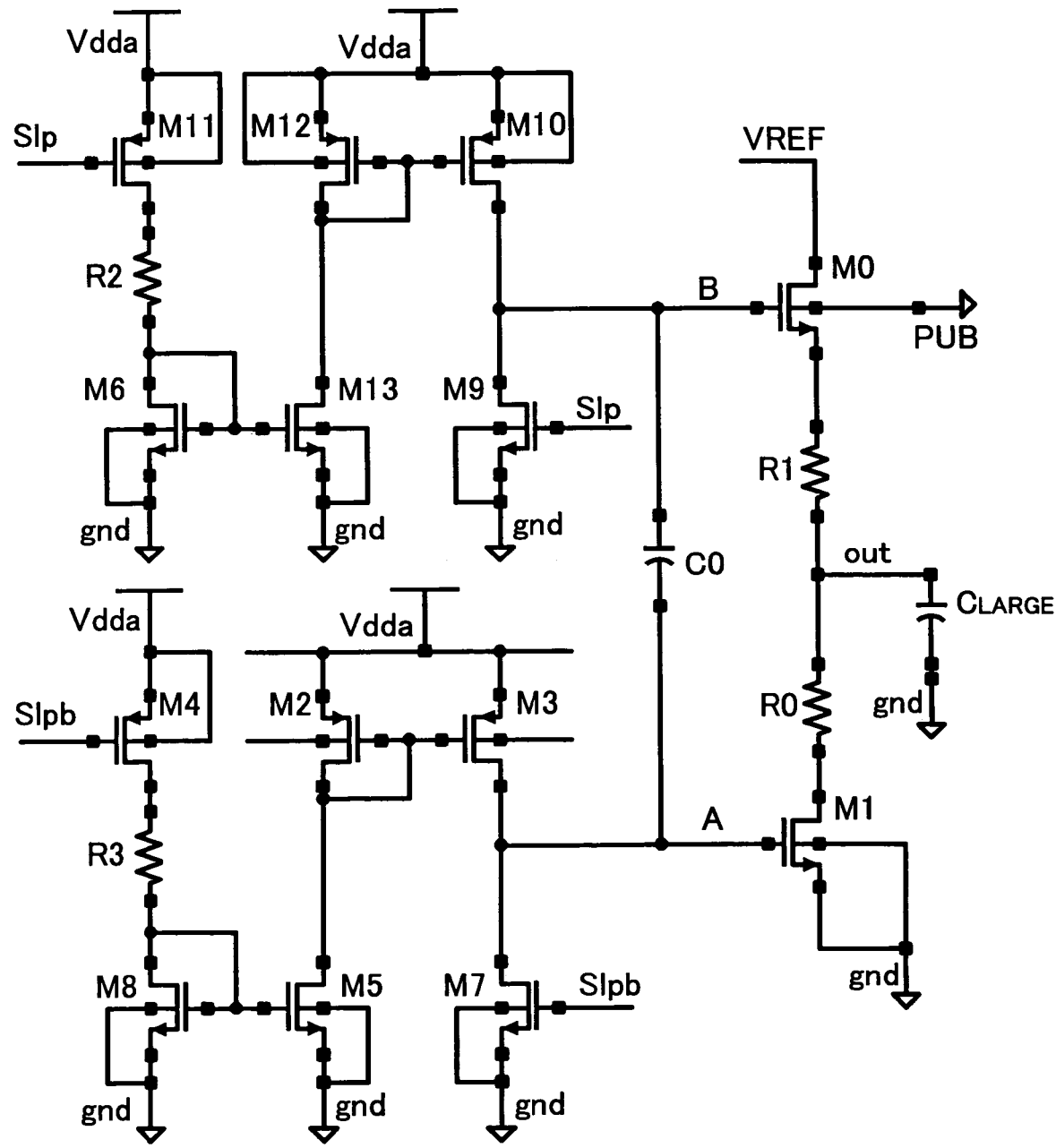
FIG. 3 illustrates an exemplary circuit, according to a preferred embodiment of the present disclosure.
Figure 6:
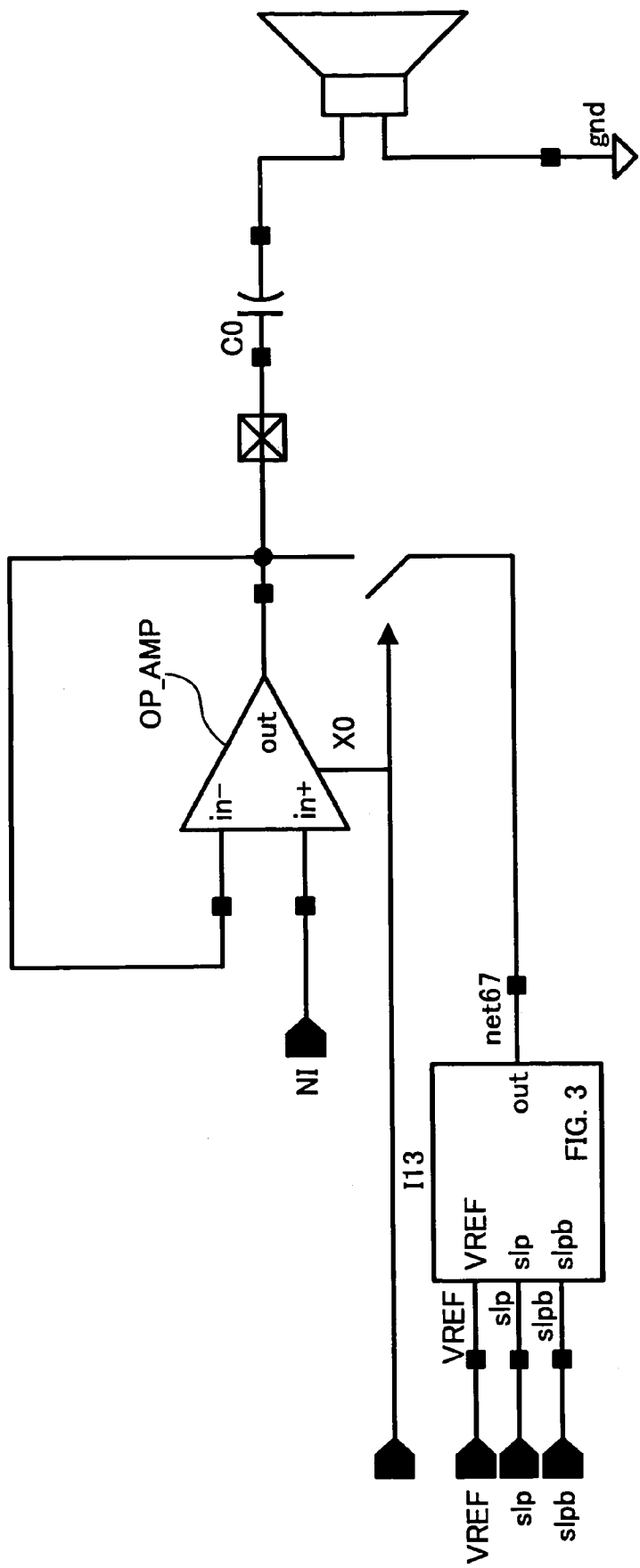
FIG. 6 illustrates a circuit of an amplifier driving an acoustic element, according to another embodiment which employs such a semiconductor integrated circuit.

Another embodiment may be a headphone amplifier again including the semiconductor circuit of FIG. 3, as shown in FIG. 6. An output of the driving amplifier may be controlled to be HI-Z (i.e., high impedance) in a sleeping mode. A sleep signal of the semiconductor circuit of FIG. 3 varies when the driving amplifier is in a sleeping mode. Specifically, the driving amplifier is turned OFF when an operational condition changes, as shown in FIG. 6. Thus, a voltage which is output from the driving amplifier is smoothly changed by a circuit (not shown) other than the driving amplifier.

For example, a driving amplifier initially enters into a sleep mode, and the capacitor Co is smoothly discharged, and the sleeping mode is realized. Otherwise, the capacitor C0 is smoothly charged, and the driving amplifier escapes from the sleep mode, and the operational condition is realized. By controlling in such a manner, a pop sound can be suppressed.

The above specific embodiments are illustrative, and many variations can be introduced on these embodiments without departing from the spirit of the disclosure or from the scope of the appended claims. For example, elements and/or features of different illustrative embodiments may be combined with each other and/or substituted for each other within the scope of this disclosure and appended claims.

This specification claims priority under 35 U.S.C. § 119 to Japanese Patent Application No. 2003-017506, filed on Jan. 27, 2003, the entire contents of which are herein incorporated by reference.

What is claimed is:

1. A semiconductor integrated circuit comprising:
    a capacitor element which defines a prescribed decay time constant with at least one resistor;
    an MOS transistor connected to the capacitor element via a gate; and
    a constant current generating element operative to generate a constant current,
    wherein a linearly changing voltage is applied to the gate of the MOS transistor by charging the capacitor element with the constant current, said linearly changing voltage causing the MOS transistor to output a smoothly changing current in accordance with the linearly changing voltage.

2. A driving amplifier for driving an acoustic element, said driving amplifier comprising the semiconductor integrated circuit as claimed in claim 1, wherein an output of the driving amplifier is smoothly changed using the linearly changing voltage generated by the semiconductor integrated circuit when an operational condition changes.

3. The driving as claimed in claim 2, further comprising an inversion operational amplifier having a positive reference input terminal, wherein an output of said semiconductor integrated circuit is applied to the positive reference input terminal.

4. The semiconductor integrated circuit of claim 1, wherein an output of a driving amplifier for driving an acoustic element is smoothly changed using the linearly changing voltage generated by the semiconductor integrated circuit, when an operational condition changes.

5. A method for driving an acoustic element, comprising:
generating a linearly changing voltage by applying a constant current to charge a capacitor element which defines a prescribed decay time constant with one or more resistors; and
applying the linearly changing voltage to a gate of a MOS transistor to generate a smoothly changed current, when an operational condition changes.

6. The method of claim 5, further comprising:
supplying the smoothly changed current to the acoustic element.

* * * * *